(12) United States Patent
Bauer

(10) Patent No.: US 9,576,839 B2
(45) Date of Patent: Feb. 21, 2017

(54) SUBSTRATE CARRIER ARRANGEMENT, COATING SYSTEM HAVING A SUBSTRATE CARRIER ARRANGEMENT AND METHOD FOR PERFORMING A COATING PROCESS

(71) Applicant: OSRAM Opto Semiconductors GmbH, Regensburg (DE)

(72) Inventor: Thomas Bauer, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 193 days.

(21) Appl. No.: 14/383,520

(22) PCT Filed: Feb. 20, 2013

(86) PCT No.: PCT/EP2013/053369
§ 371 (c)(1),
(2) Date: Sep. 5, 2014

(87) PCT Pub. No.: WO2013/131748
PCT Pub. Date: Sep. 12, 2013

(65) Prior Publication Data
US 2015/0031192 A1 Jan. 29, 2015

(30) Foreign Application Priority Data
Mar. 7, 2012 (DE) .......................... 10 2012 101 923

(51) Int. Cl.
*H01L 21/687* (2006.01)
*B05C 13/02* (2006.01)
(Continued)

(52) U.S. Cl.
CPC ......... *H01L 21/68742* (2013.01); *B05C 13/02* (2013.01); *C23C 16/458* (2013.01); *H01L 21/02365* (2013.01); *H01L 21/67109* (2013.01)

(58) Field of Classification Search
None
See application file for complete search history.

(56) References Cited

U.S. PATENT DOCUMENTS

| 4,860,687 A | 8/1989 | Frijlink |
| 6,320,736 B1 | 11/2001 | Shamouilian et al. |
| (Continued) | | |

FOREIGN PATENT DOCUMENTS

| DE | 10261362 A1 | 7/2004 |
| DE | 102009044276 A1 | 5/2011 |
| (Continued) | | |

OTHER PUBLICATIONS

Machine translation of DE 102009044276A1, obtained from Google Patents on May 9, 2016, 11 pages.*

*Primary Examiner* — Brett Feeney
*Assistant Examiner* — Erik T Peterson
(74) *Attorney, Agent, or Firm* — McDermott Will & Emery LLP

(57) ABSTRACT

A substrate carrier arrangement (10, 11) for a coating system (12) is provided, comprising a carrier (1) which comprises at least one support region (3) having a support surface (30), on which a substrate support (2) is arranged, and which support region comprises in the support surface (30) at least one first and one second gas inlet (4, 5), wherein the first gas inlet (4) is at a smaller distance from a center (M) of the support surface (30) than the second gas inlet (5) and wherein the first and second gas inlet (4, 5) comprise mutually independent gas feeds (40, 50) which are arranged to supply gases having mutually different thermal conductivities. A coating system comprising a substrate carrier arrangement and a method for performing a coating process are also provided.

13 Claims, 2 Drawing Sheets

Figure 1A:
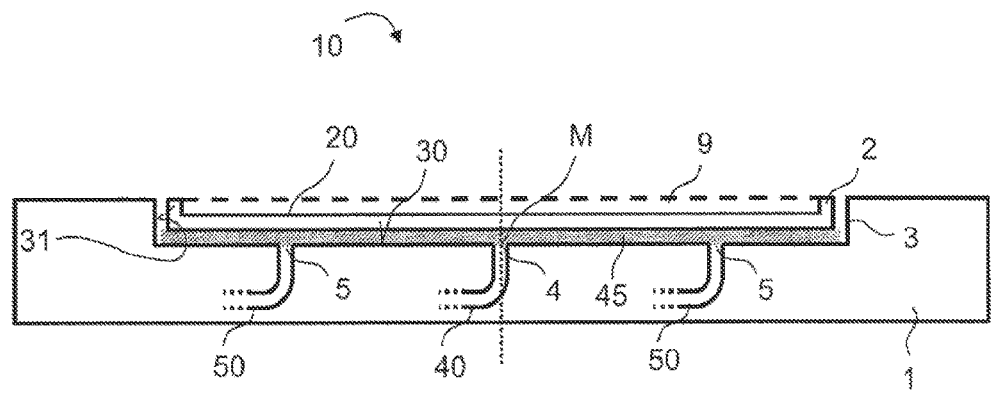

(51) Int. Cl.
*H01L 21/02* (2006.01)
*C23C 16/458* (2006.01)
*H01L 21/67* (2006.01)

(56) References Cited

U.S. PATENT DOCUMENTS

| | | | | |
|---|---|---|---|---|
| 6,797,069 | B2* | 9/2004 | Paisley | C23C 16/4584 118/500 |
| 7,037,797 | B1* | 5/2006 | Shooshtarian | H01L 21/67109 438/308 |
| 7,156,951 | B1 | 1/2007 | Gao et al. | |
| 2003/0233768 | A1* | 12/2003 | Kaeppeler | C23C 16/4584 34/560 |
| 2004/0043639 | A1* | 3/2004 | Mitrovic | C23C 16/4586 438/795 |
| 2004/0231599 | A1* | 11/2004 | Schwambera | C23C 16/45563 118/728 |
| 2008/0206464 | A1* | 8/2008 | Kappeler | C23C 16/4581 427/255.394 |
| 2008/0227227 | A1* | 9/2008 | Sundararajan | H01L 22/20 438/14 |
| 2008/0280453 | A1* | 11/2008 | Koelmel | H01L 21/67115 438/758 |
| 2009/0110805 | A1* | 4/2009 | Kaeppeler | C23C 16/4584 427/8 |
| 2009/0194264 | A1* | 8/2009 | Sasaki | H01L 21/67109 165/138 |
| 2011/0303154 | A1* | 12/2011 | Kim | H01L 21/68764 118/728 |
| 2012/0160808 | A1* | 6/2012 | Kikuchi | H01J 37/32165 216/67 |
| 2012/0204796 | A1* | 8/2012 | Ruda Y Witt | C23C 16/458 118/725 |

FOREIGN PATENT DOCUMENTS

| | | |
|---|---|---|
| EP | 2398047 A2 | 12/2011 |
| WO | 01/69656 A2 | 9/2001 |
| WO | 2006/058847 A1 | 6/2006 |
| WO | 2011/151996 A1 | 12/2011 |

* cited by examiner

SUBSTRATE CARRIER ARRANGEMENT, COATING SYSTEM HAVING A SUBSTRATE CARRIER ARRANGEMENT AND METHOD FOR PERFORMING A COATING PROCESS

This patent application claims the priority of German patent application 10 2012 101 923.1, the disclosure content of which is hereby incorporated by reference.

A substrate carrier arrangement, a coating system having a substrate carrier arrangement and a method for performing a coating process are provided.

In order to produce semiconductor chips, e.g. light-emitting diode chips which are based upon compound semiconductor materials, such as e.g. AlInGaN, large areas of substrate wafers are coated with the semiconductor material. The composition of the individual layers at various positions on the wafer depends upon the local temperature of the substrate wafer. Temperature gradients can occur e.g. by reason of non-uniform heating of the wafer and/or by non-uniform and locally different cooling of the wafer for instance by virtue of the surrounding components.

For example, the In-inclusion in GaN is greatly dependent upon temperature. However, the emission wavelength of InGaN-light-emitting diode structures depends upon the In content in an active layer of a semiconductor layer sequence. If the substrate wafer has temperature inhomogeneities e.g. in the form of temperature gradients, then this produces an In-inclusion into the active layer which varies over the wafer. The semiconductor chips which can be isolated from the wafer coated with the semiconductor layer sequence thus emit light at different wavelengths. Even in the case of different layers e.g. of light-emitting diode structures, approximately radial temperature inhomogeneities lead to problems, e.g. an excessively low temperature on the wafer edge leads to so-called pits, i.e. holes during growth of the semiconductor material.

Document U.S. Pat. No. 4,860,687 discloses an apparatus, in which the wafer support, on which the substrate wafer is mounted during the growing process, is rotated by means of a gas stream. Although the temperature distribution over the wafer is homogenized during epitaxial growth by rotation of the wafer support and the inhomogeneities can thus be reduced, radial temperature gradients cannot be completely prevented thereby. Therefore, light-emitting diode structures on wafers which are coated in coating systems having rotating wafer supports can demonstrate, with regard to the respectively emitted light of the semiconductor chips produced therefrom, an undesired radial wavelength inhomogeneity.

From document DE 102 61 362 A1 it is known, for the purpose of homogenizing the temperature over the entire surface of the wafer, to provide a temperature equalization structure in the wafer support which is achieved in the form of a radial profiling of the wafer support. The use of recesses or elevations is an attempt to smooth the temperature profile of the wafer. For example, in comparison with a wafer support without a temperature equalization structure, a recess in the center of the wafer support can reduce the temperature in the wafer center and in the case of an active layer based upon InGaN it can thus also increase the wavelength which can be produced locally by the active layer at this location, whereas an elevation at one location of the wafer support leads to a local increase in the temperature at the corresponding position of the wafer and thus to a reduction in the wavelength which can be produced by the active layer at this location. As a result, a homogenization of the temperature profile can be achieved over the wafer surface in comparison with a wafer support without a temperature equalization structure. However, by means of such unchangeable profiling of wafer support only one layer of the semiconductor layers applied on the wafer can be optimized.

At least one object of specific embodiments is to provide a substrate carrier arrangement, by means of which the temperature distribution of a substrate can be influenced. At least one further object of specific embodiments is to provide a coating system having a substrate carrier arrangement. A further object of specific embodiments is to provide a method for performing a coating process.

These objects are achieved by objects and methods in accordance with the independent claims. Advantageous embodiments and developments of the objects and methods are characterized in the dependent claims and are also apparent from the description hereinafter and the drawings.

In accordance with at least one embodiment, a substrate carrier arrangement comprises a carrier, on which a substrate support is arranged. The substrate support is provided and arranged to receive and support a substrate, in particular a substrate to grow a semiconductor layer sequence. The substrate support can consist of e.g. graphite and can be designed in a plate-like manner. In particular, the substrate support can have a recess which is arranged facing away from the carrier or the support surface and is provided for receiving a substrate.

In particular, the substrate carrier arrangement can be provided for use in a coating system.

In accordance with a further embodiment, the carrier comprises at least one support region having a support surface, on which the substrate support is arranged. Furthermore, the carrier comprises in the support surface at least one first and one second gas inlet, wherein the first gas inlet is at a smaller distance from a center of the support surface than the second gas inlet.

In particular, the substrate support and the support region can be formed in each case in a circular manner, so that the at least one first gas inlet is at a smaller radial distance from the center of the support region than the at least one second gas inlet.

Furthermore, the at least one first and the at least one second gas inlet comprise mutually independent gas feeds which are arranged to supply gases having mutually different thermal conductivities. In other words, this means that the first gas inlet comprises a first gas feed, by means of which a first gas can be fed through the support surface into the support region. The second gas inlet comprises a second gas feed, through which a second gas can be fed through the support surface to the support region. The first gas and the second gas have mutually different thermal conductivities.

Furthermore, the carrier can comprise a heating apparatus, by means of which the substrate support can be heated. The transfer of heat between the carrier and the substrate support is effected via the support surface onto the rear side of the substrate support facing towards the carrier.

By supplying the gases through the at least one first and the at least one second gas inlet, a gas cushion is produced, during operation, between the support surface and the substrate support, on which gas cushion the substrate support is arranged spaced apart from the support surface. In this case, the supplied gases thus form a common, continuous gas cushion, whose local composition is dependent upon the respective gas flows and supplied gases. By reason of the supply of the gases with the mutually different thermal conductivities through the gas inlets which are at a different distance from the center of the support surface and thus also the center of the substrate support, the gas cushion can have a varying thermal conductivity in dependence upon a distance from the center.

In contrast thereto, in the prior art it is merely known to produce a rotation of the substrate support by only one gas inlet beneath the center of the substrate surface. By increasing the gas flow, it is possible to achieve a larger distance between the support surface and the substrate support and thus a lower temperature of the substrate support and of the substrate arranged thereon, wherein e.g. in the case of InGaN-based light-emitting diode structures a larger emission wavelength of the emission region is produced. However, the temperature in the center of the substrate support and at the edge of the substrate support is only changed collectively.

In contrast, in the case of the substrate carrier arrangement described in this case, it is possible to use different gas compositions for a region closer to the center of the support surface and the substrate support and for a region further away from the center of the support surface and the substrate support, as the gases with the mutually different thermal conductivities are supplied at different distances from the center of the support surface and the substrate support. If the gas cushion has a lower thermal conductivity e.g. close to the center of the support surface, the center of substrate support is heated to a lesser extent owing to the poorer thermal conduction between the support surface and the rear side of the substrate support facing towards the carrier, so that e.g. in the case of the aforementioned light-emitting diode structures having InGaN-based active layers in the center of the substrate, emission regions having an emission wavelength which is longer compared to conventional substrate carrier arrangements can be achieved.

In particular, the at least one substrate support and the at least one support surface can have in each case no temperature equalization structure, e.g. in the form of a radial height profile, as is known e.g. from DE 102 61 362 A1.

In accordance with a further embodiment, at least one of the supplied gases comprises one or a plurality of the following gases or consists of one or a mixture of the following gases: $H_2$, He, $CH_4$, $N_2$, Ar, Kr, Xe. Preferably, all of the supplied gases can each comprise or consist of one of the said gases or a mixture thereof. The thermal conductivity of the said gases decreases in the aforementioned sequence, so that by selecting the gases and gas quantities supplied in each case through the gas inlets, the varying thermal conductivity of the gas cushion can be adjusted.

In accordance with a further embodiment, the gases which are supplied through the at least one first and/or at least one second gas inlet comprise $N_2$ and/or $H_2$. For example, pure $N_2$ or even a mixture of $N_2$ and $H_2$ can be supplied through the at least one first gas inlet. A different mixture of $H_2$ and $N_2$ or even pure $H_2$ can be supplied through the at least one second gas inlet which in comparison with the at least one first gas inlet is further away from the center of the substrate support and the support surface. Since $N_2$ has a poorer thermal conductivity than $H_2$, the thermal conductivity of the respectively fed gases can be adjusted by the mixture ratio of $N_2$ and $H_2$.

By means of the substrate carrier arrangement described in this case, the radial temperature distribution over the substrate support and thus over a substrate arranged on the substrate support can be flexibly adjusted by adjusting the gas flows through the at least one first and the at least one second gas inlet. In particular, the temperature homogeneity or temperature distribution can be optimally adjusted for various layers within a semiconductor layer structure such as e.g. a light-emitting diode structure which is grown on the substrate, for various light-emitting diode structures, for changing properties of the substrate, e.g. a bending of the substrate ("wafer bow") or other substrate influences, and for edge occupancy of the substrate support, as e.g. the GaN-growth influences emissivity particularly at this location.

In accordance with a further embodiment, the at least one first gas inlet is arranged in the center of the support surface, so that the substrate carrier arrangement comprises only one first gas inlet. Alternatively, it can also be possible that the at least one first gas inlet comprises a plurality of first gas inlets which are arranged distributed in a rotationally symmetrical manner about the center. In other words, this means that the first gas inlets are arranged about the center at uniform angular distances with respect to each other and at the same radial distance from the center of the support surface.

In accordance with a further embodiment, the at least one second gas inlet comprises a plurality of second gas inlets which are arranged distributed in a rotationally symmetrical manner about the center of the support surface. In accordance with a further embodiment, the at least one second gas inlet and preferably a plurality of second gas inlets is/are arranged close to the edge of the support surface and thus also close to the edge of the substrate support.

The number and position of the first and second gas inlets can be provided depending upon the desired gas quantity to be supplied and the distribution thereof. For example, two, three, four or more gas inlets can be provided as the first and/or second gas inlets which are arranged spaced apart from the center. A plurality of respective first and respective second gas inlets is characterized by virtue of the fact that the first gas inlets are each at the same first distance from the center of the support surface and the second gas inlets are each at the same second distance from the center of the support surface, wherein the second distance is larger than the first distance.

In accordance with a further embodiment, the support surface has at least one third gas inlet disposed therein which is at a distance from the center of the support surface which is different from the at least one first or the at least one second gas inlet. The at least one third gas inlet also comprises a gas feed, which is independent of the gas feeds of the at least one first and the at least one second gas inlet, for the purpose of supplying a gas which has a thermal conductivity which differs from the thermal conductivity of the gas which is fed through the at least one first gas inlet. Furthermore, the gas fed through the third gas inlet can have a thermal conductivity which differs from the thermal conductivity of the gases which are fed through the at least one first and the at least one second gas inlet. Furthermore, it is also possible for a plurality of third gas inlets to be arranged distributed in a rotationally symmetrical manner about the center of the support surface.

The more gas inlets are arranged at various distances from the center of the support, the more individually the thermal conductivity of the gas cushion, which forms between the substrate support and the support surface, can be adjusted, so that as a result the temperature distribution of the substrate support in the radial direction can be influenced even more effectively.

In accordance with a further embodiment, the support region is formed as a recess for receiving the substrate support. The support surface forms a base surface of the recess. Furthermore, the support region comprises an edge surface which adjoins the support surface. The edge surface can be spaced apart at least partially from the substrate support. In other words, the support region can be spaced apart at least partially in the radial direction from the substrate support. As a result it can be possible that the gases which are supplied by the gas feeds and form a gas cushion between the support surface and the substrate support can flow out laterally past the substrate support.

In accordance with a further embodiment, the substrate support in the rear side, facing towards the carrier, and/or the support surface of the at least one support region comprise at least one channel which is provided in order to effect a rotational movement of the substrate support in the support region by means of the inflowing gases. Such measures for rotating a substrate support on a support surface are known from document U.S. Pat. No. 4,860,687, the disclosure content of which in this respect is completely incorporated by reference.

In accordance with a further embodiment, the carrier comprises a plurality of support regions, on which in each case a substrate support is arranged. The plurality of support regions can be arranged e.g. with rotational symmetry in a circular manner about a center of the carrier. In this case, the carrier can also be defined as a so-called planet, whereas the substrate supports are defined as so-called satellites. Each of the support regions can comprise the previously described gas inlets, so that individually a temperature distribution can be regulated by the respectively supplied gases for each substrate support.

In accordance with a further embodiment, a coating system for coating at least one substrate with a semiconductor material comprises a coating chamber, in which a substrate carrier arrangement in accordance with one or several of the previous exemplified embodiments is arranged.

In accordance with a further embodiment, a substrate carrier arrangement in accordance with one or several of the previous embodiments is used in the case of a method for performing a coating process for coating a substrate with a semiconductor material. Gases having different thermal conductivities are supplied through the at least one first gas inlet and the at least one second gas inlet and form a gas cushion between the substrate support and the support surface, on which gas cushion the substrate support hovers above the support surface and which gas cushion has a varying thermal conductivity in dependence upon a distance from the center of the support surface.

In accordance with a further embodiment, in the case of the method a temperature distribution of the substrate is homogenized by regulating the supply of the gases through the at least one first and the at least one second gas inlet.

Figure 1B:
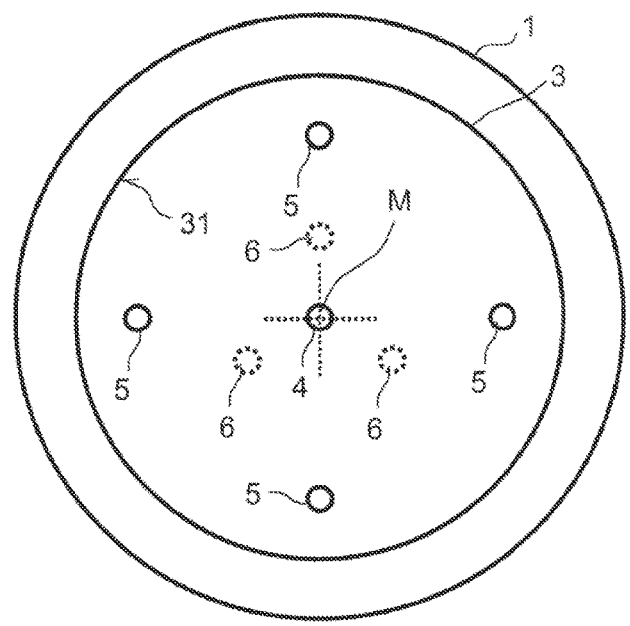
Figure 2:
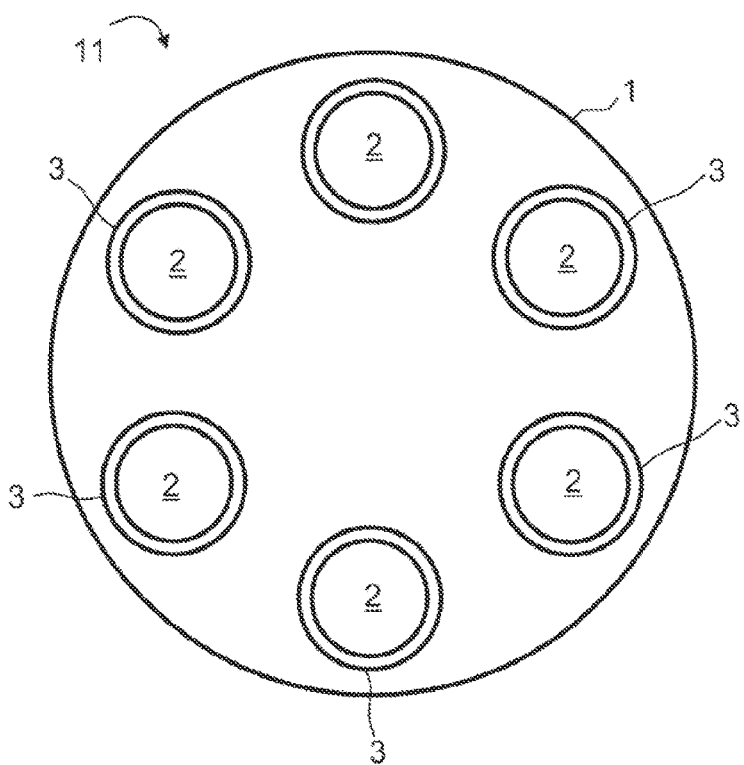
Figure 3:
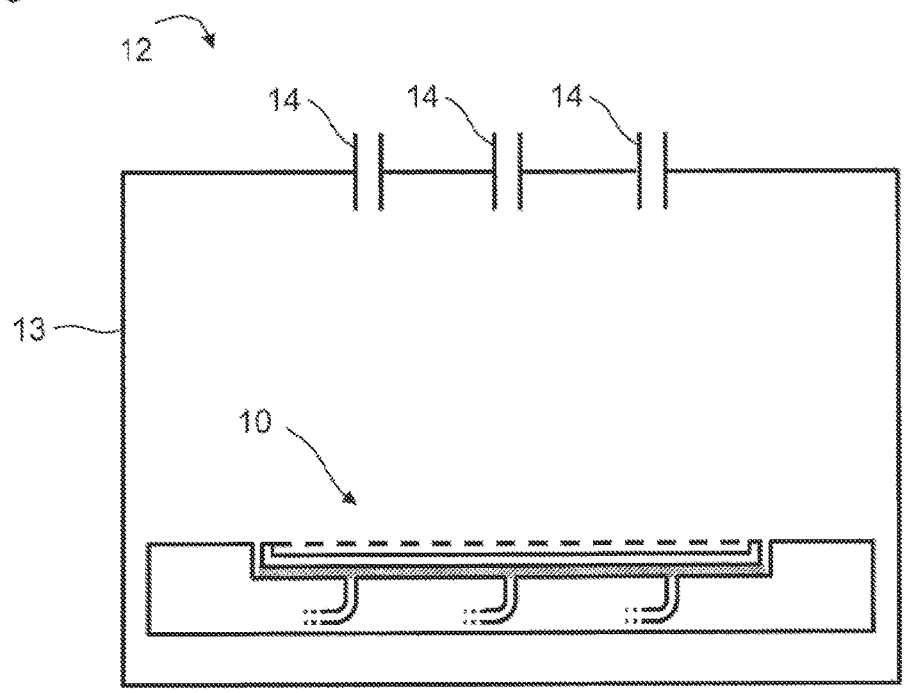

Further advantages, advantageous embodiments and developments will be apparent from the exemplified embodiments described hereinafter in conjunction with the figures, in which:

FIG. 1A shows a schematic view of a substrate carrier arrangement in accordance with one exemplified embodiment, FIG. 1B shows a top view of the carrier of the substrate carrier arrangement of FIG. 1A, FIG. 2 shows a schematic view of a substrate carrier arrangement in accordance with a further exemplified embodiment and FIG. 3 shows a coating system having a substrate carrier arrangement in accordance with a further exemplified embodiment.

In the exemplified embodiments and figures, like elements, or elements acting in a similar or identical manner, can be provided with the same reference numerals in each case. The illustrated elements and their size ratios with respect to each other are not to be regarded as being to scale. Rather, individual elements, such as e.g. layers, components, devices and regions, may be illustrated excessively large to provide a clearer illustration and/or for greater ease of understanding.

FIG. 1A shows a schematic sectional view of a substrate carrier arrangement 10 in accordance with one exemplified embodiment which comprises a carrier 1 and a substrate support 2 arranged thereon. In FIG. 1B, the carrier 1 of FIG. 1A is shown in a schematic view without the substrate support 2. The description hereinafter relates equally to FIGS. 1A and 1B.

The carrier 1 comprises a support region 3, in which the substrate support 2 is arranged. For this purpose, the support region 3 comprises a support surface 30 which faces towards the substrate support 2 and on which the substrate support 2 is arranged with a rear side. For this purpose, in the illustrated exemplified embodiment the support region 3 is formed as a recess, in which the support surface 30 forms the base surface. Furthermore, the support surface 30 is adjoined by an edge surface 31 of the support region 3.

The substrate support 2 which can consist e.g. of graphite comprises a recess 20 which faces away from the carrier 1 and in which a substrate 9, indicated by the dashed line, can be arranged. The shape of the substrate support 2 and thus also of the support surface 30 is governed by the shape of the substrate 9 which is provided in the form of a wafer, e.g. from a semiconductor material or an isolating material, e.g. sapphire, GaAs, GaP, GaN, InP, SiC, Si or Ge. Typically, such wafers are produced as circular disks, so that the substrate support 2 and also the support surface 30 of the support region 3 are preferably also circular.

The substrate 9 can be provided e.g. as a growth substrate for a compound semiconductor material, e.g. based upon $In_xGa_yAl_{1-x-y}As$, $In_xGa_yAl_{1-x-y}P$ or $In_xGa_yAl_{1-x-y}N$, wherein in each case $0 \leq x \leq 1$ and $0 \leq y \leq 1$.

Furthermore, the carrier 1 can comprise a heating apparatus (not shown), by means of which the substrate support 2 can be heated. Heat is transferred between the carrier 1 and the substrate support 2 from support surface 30 to the rear side of the substrate support 2 facing towards the carrier 1.

Furthermore, the carrier 1 comprises a first gas inlet 4 and second gas inlets 5 which are arranged in a support surface 30. The gas inlets 4, 5 serve in each case to allow a gas to flow into the support region 3, i.e. between the support surface 30 and the substrate support 2, so that between the support surface 30 and the substrate support 2 a gas cushion 45 can be produced which is indicated by the shaded region. As shown in FIG. 1A, the gases supplied form a common, continuous gas cushion 45. The edge surface 31 of the support region 3 can be arranged spaced at least partially from the substrate support 2, as also indicated in FIG. 1A, so that the gas of the gas cushion 45 can flow out laterally past the substrate support 2. For example, in the support surface 30 and/or in the rear side of the substrate support 2 facing towards the carrier 1, suitable channels or furrows can be formed, by means of which a rotational movement of the substrate support 2 relative to the carrier 1 can be achieved by reason of the gas flowing in through the gas inlets 4, 5, as described e.g. in document U.S. Pat. No. 4,860,687. For this purpose, the carrier 1 can still comprise a suitable guide for the substrate support 2.

The first gas inlet 4 is at a smaller distance from the center M of the support surface 30, which is indicated by the dotted line, than the second gas inlets 5.

In particular, in the illustrated exemplified embodiment the first gas inlet 4 is arranged in the center M, whereas the second gas inlets 5 are arranged equally spaced apart from the center M and distributed in a rotationally symmetrical manner about the center M. Purely by way of example, the carrier 1 in the illustrated exemplified embodiment comprises four second gas inlets 5.

As an alternative to the illustrated exemplified embodiment, instead of providing the one first gas inlet 4, a plurality of first gas inlets can also be provided which can then be arranged distributed in a rotationally symmetrical manner about the center M at the same distance from the center M. Furthermore, it is also possible for more or fewer second gas inlets 5 to be provided. The number of first and second gas inlets 4, 5 and their respective distance from the center M can be selected in particular such that a desired composition of the supplied gases in the gas cushion 45 can be achieved.

The first gas inlet 4 and the second gas inlets 5 comprise mutually independent gas feeds 40, 50 which are provided for the purpose of supplying gases having mutually different thermal conductivities. In particular, in the case of a method for coating the substrate 9 with a semiconductor material a first gas is supplied through the first gas inlet 4 with the associated first gas feed 40 and a second gas is supplied through the gas inlets 5 with the associated gas feeds 50, wherein the first gas has a thermal conductivity which is different from the second gas. As a result, it is possible to control in a targeted manner the composition of the gas cushion 45 between the support surface 3 and the substrate support 2 by the respectively fed gases and gas quantities.

Furthermore, it is also possible that in addition to the first and second gas inlets 4, 5, further gas inlets, e.g. at least one or a plurality of third gas inlets 6 are arranged in the support region 3, as indicated in FIG. 1B, which is at a distance from the center M, which is different from the first and second gas inlets 4, 5, and has an independent gas feed for supplying a third gas having a thermal conductivity which is different from the first gas and from the second gas. Alternatively, the gas supplied through the third gas inlets 6 can also correspond to one of the first and/or second gases.

Whereas the distance of the substrate support 2 from the support surface 30 and thus an average temperature of the substrate support 2 can be controlled by adjusting the entire gas flow through all of the gas inlets 4, 5, the temperature can be influenced in a radial direction by the individual composition of the gases, which are supplied through the gas inlets 4, 5, and therefore the composition of the gas cushion 45 which forms.

For example, $N_2$ can be supplied through the first gas inlet 4 as the first gas, whereas $H_2$ is supplied through each of the second gas inlets 5 as the second gas. By virtue of the fact that $N_2$ has a poorer thermal conductivity than $H_2$ and the second gas inlets 5 are arranged close to the edge of the substrate support 2 and in particular further away from the center M than the first gas inlets 4, a gas cushion 45 is achieved which has a poorer thermal conductivity in the center M, i.e. also below the center of the substrate support 2, than close to the edge of the substrate support 2. As a result, the transfer of heat of a heating apparatus in the carrier 1 is greater at the edge of the substrate support 2 than in the center of the substrate support 2. The edge of the substrate support 2 can thus be heated more strongly than the center of the substrate support 2, as the gas cushion 45 has a varying thermal conductivity in dependence upon a distance from the center M. Therefore, in the case of the substrate carrier arrangement 10 without a temperature equalization profile on the substrate support 2 or on the carrier 1, as is known from the prior art, it may be possible to adjust the radial temperature distribution over the substrate support 2 and thus over the substrate 9 to be coated. By means of a reversed gas feed, a high level of heating of the center of the substrate support 2 can be achieved accordingly. As an alternative or in addition to the aforementioned gases $N_2$ and $H_2$, further gases can also be selected from one or a plurality of the following gases: He, $CH_4$, Ar, Kr, Xe.

In particular, the adjustment of the radial temperature distribution of the substrate support 2 and thus also of the substrate 9 can be effected flexibly and in optimum fashion for different layers to be applied, different semiconductor structures, e.g. different light-emitting diode structures, and for changing substrate conditions such as e.g. bending of the substrate, a so-called "wafer bow". Furthermore, the edge occupancy of the substrate 9, i.e. the growth of a semiconductor material on the substrate 9 close to the edge of the substrate support 2, can be influenced. Should e.g. an InGaN-based semiconductor material, e.g. for the active region of a light-emitting diode structure, be grown on the substrate 9, the adjustability of the radial temperature distribution over the substrate 9, as described in this case, can reduce the wavelength inhomogeneity of the active region, which is typically produced in coating systems, over the substrate surface by reason of radial temperature gradients.

FIG. 2 shows a schematic view of a substrate carrier arrangement 11 in accordance with a further exemplified embodiment.

In comparison with the previous exemplified embodiment, the substrate carrier arrangement 11 comprises a carrier 1 which comprises a plurality of support regions 3, in which a respective substrate support 2 is arranged. In the illustrated exemplified embodiment, the carrier 1 comprises six support regions 3 for arranging six substrate supports 2 and therefore for arranging six substrates to be coated. The support regions 3 are arranged in a circular and rotationally symmetrical manner about a center of the carrier 1.

The carrier 1 can be mounted e.g. in a rotatable manner and is also often defined in this context as a so-called planet, whereas the substrate supports 2 which for their part can be rotatable individually and independently of one another can be defined as satellites. The support regions 3 can be designed in each case like the support region 3 in the previous exemplified embodiment of FIGS. 1A and 1B. In particular, the gas inflows in the individual support regions 3 can be regulated independently of one another. The substrate carrier arrangement 11 can be suitable e.g. for coating typical two inch, four inch or six inch substrates.

FIG. 3 shows a coating system 12 which comprises a coating chamber 13, in which a substrate carrier arrangement is arranged. Purely by way of example, the coating system 12 comprises a substrate carrier arrangement 10 in accordance with the exemplified embodiment of FIGS. 1A and 1B. Alternatively, the substrate carrier arrangement can be designed e.g. also in accordance with the exemplified embodiment in FIG. 2.

The semiconductor materials, e.g. in the form of hydrides and/or organometallic compounds, which are required for coating purposes can be supplied and residual products produced during the growing process and other exhaust gases can be discharged by means of lines 14 in the coating chamber 13. The basic construction of coating systems is known to the person skilled in the art and therefore will not be described further here.

By means of the coating system 12, a coating method for coating a substrate with a semiconductor material can be performed, in which, by using one of the illustrated substrate carrier arrangements, gases having different thermal conductivities can be supplied through the at least one first gas inlet 4 and the at least one gas inlet 5, which gases, as described in conjunction with FIG. 1A, form a gas cushion 45 between the substrate support 2 and the support surface 30 of the carrier 1, on which gas cushion the substrate support 2 hovers above the support surface 30 and which has a varying, i.e. radially varying, thermal conductivity in dependence upon a distance from the center M of the support surface 30. Consequently, as described in conjunction with the previous exemplified embodiments, it is possible to adjust in a targeted manner and e.g. to homogenize the temperature profile of the substrate, which is to be coated, during the coating procedure individually and according to the layer and/or material to be applied, in order to be able to apply semiconductor layer sequences which, where possible, have the same properties over the entire substrate, for instance an active region with an emission wavelength which is identical or as identical as possible.

The exemplified embodiments shown in the figures can have further or alternative features as described in the general part, even if these features are not explicitly shown in the figures. Furthermore, further exemplified embodiments can also have combinations of the features and exemplified embodiments shown in the figures, even if these are not explicitly shown.

The invention is not limited by the description using the exemplified embodiments. Rather, the invention includes any new feature and any combination of features included in particular in any combination of features in the claims, even if this feature or this combination itself is not explicitly stated in the claims or exemplified embodiments.

The invention claimed is:

1. A substrate carrier arrangement for a coating system, comprising:
   a carrier which comprises at least one support region having a support surface, on which a substrate support is arranged, and which support region comprises in the support surface at least one first and one second gas inlet,
   wherein the first gas inlet is at a smaller distance from a center (M) of the support surface than the second gas inlet,
   wherein the first and second gas inlet have mutually independent gas feeds which are arranged to supply gases, having mutually different thermal conductivities, through the at least one first and the at least one second gas inlet, to produce a common, continuous gas cushion, during operation, between the support surface and the substrate support, on which gas cushion the substrate support is arranged spaced apart from the support surface and which gas cushion has a varying thermal conductivity in dependence upon a distance from the center (M), and
   wherein the support region comprises an edge surface which adjoins the support surface and which is at least partially spaced apart from the substrate support, so that the gases which are supplied by the gas feeds and form the gas cushion between the support surface and the substrate support can flow out laterally past the substrate support.

2. The substrate carrier arrangement according to claim 1, wherein the at least one first gas inlet is arranged in the center (M) of the support surface.

3. The substrate carrier arrangement according to claim 1, wherein the at least one first gas inlet comprises a plurality of first gas inlets which are arranged distributed in a rotationally symmetrical manner about the center (M).

4. The substrate carrier arrangement according to claim 1, wherein the at least one second gas inlet comprises a plurality of second gas inlets which are arranged distributed in a rotationally symmetrical manner about the center (M).

5. The substrate carrier arrangement according to claim 1, wherein the support region is formed as a recess for receiving the substrate support and the support surface forms a base surface of the recess.

6. The substrate carrier arrangement according to claim 1, wherein the substrate support has a rear surface facing the support surface, the rear surface being flat, and the support surface is flat except for the gas inlets.

7. The substrate carrier arrangement according to claim 1, wherein the at least one substrate support comprises a recess, facing away from the carrier, for receiving a substrate.

8. The substrate carrier arrangement according to claim 1, wherein the carrier comprises a plurality of support regions, on each of which a substrate support is arranged.

9. The substrate carrier arrangement according to claim 1, wherein disposed in the support surface is at least one third gas inlet which is at a distance from the center (M), which is different from the distances from the center (M) of the at least one first and the at least one second gas inlet, and comprises an independent gas feed for supplying a gas having a thermal conductivity which is different from the gas fed through the at least one first gas inlet.

10. The substrate carrier arrangement according to claim 1, wherein the support region is formed as a recess for receiving the substrate support and the support surface forms a base surface of the recess,
   wherein the support region comprises an edge surface which adjoins the support surface and which is at least partially spaced apart from the substrate support, and
   wherein the gases which are supplied by the gas feeds and form a gas cushion between the support surface and the substrate support can flow out laterally past the substrate support.

11. A coating system for coating at least one substrate with a semiconductor material, comprising:
   a coating chamber, in which a substrate carrier arrangement is arranged,
   wherein the substrate carrier arrangement comprises a carrier which comprises at least one support region having a support surface, on which a substrate support is arranged, and which support region comprises in the support surface at least one first and one second gas inlet,
   wherein the first gas inlet is at a smaller distance from a center (M) of the support surface than the second gas inlet,
   wherein the first and second gas inlet have mutually independent gas feeds which are arranged to supply gases, having mutually different thermal conductivities, through the at least one first and the at least one second gas inlet, to produce a common, continuous gas cushion, during operation, between the support surface and the substrate support, on which gas cushion the substrate support is arranged spaced apart from the support surface and which gas cushion has a varying thermal conductivity in dependence upon a distance from the center (M), and
   wherein the support region comprises an edge surface which adjoins the support surface and which is at least partially spaced apart from the substrate support, so that the gases which are supplied by the gas feeds and form the gas cushion between the support surface and the substrate support can flow out laterally past the substrate support.

12. A method for performing a coating process for coating a substrate with a semiconductor material, the method comprising:

providing for a substrate carrier arrangement, the substrate carrier arrangement comprising a carrier which comprises at least one support region having a support surface, on which a substrate support is arranged, and which support region comprises in the support surface at least one first and one second gas inlet, wherein the first gas inlet is at a smaller distance from a center (M) of the support surface than the second gas inlet, and wherein the first and second gas inlet have mutually independent gas feeds which are arranged to supply gases having mutually different thermal conductivities, and supplying gases having the different thermal conductivities through the at least one first gas inlet and the at least one second gas inlet, to produce a common, continuous a gas cushion between the substrate support and the support surface, on which gas cushion the substrate support hovers over the support surface and which gas cushion has a varying thermal conductivity in dependence upon a distance from the center (M), wherein the support region comprises an edge surface which adjoins the support surface and which is at least partially spaced apart from the substrate support, so that the gases which are supplied by the gas feeds and form the gas cushion between the support surface and the substrate support can flow out laterally past the substrate support.

13. The method according to claim 12, wherein a temperature distribution of the substrate is homogenized by regulating the supply of the gases through the at least one first and the at least one second gas inlet.

\* \* \* \* \*